United States Patent
Huang (12)

(10) Patent No.: US 6,551,412 B1
(45) Date of Patent: Apr. 22, 2003

(54) NON-TUBULAR TYPE RECYCLE SYSTEM OF WET BENCH TANK

(75) Inventor: Yuan-Sheng Huang, Hualien (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 123 days.

(21) Appl. No.: 09/905,816

(22) Filed: Jul. 16, 2001

(51) Int. Cl.$^7$ ............................. B08B 3/04; B08B 7/04
(52) U.S. Cl. ..................... 134/10; 134/105; 134/111; 134/184; 134/196; 134/902
(58) Field of Search ........................ 134/10, 34, 42, 134/105, 111, 184, 196, 902

(56) References Cited

U.S. PATENT DOCUMENTS

| | | | |
|---|---|---|---|
| 4,917,123 A | 4/1990 | McConnell et al. | 134/95 |
| 5,393,347 A | * 2/1995 | Miranda | 118/429 |
| 5,409,310 A | 4/1995 | Owczarz | 366/136 |
| 5,632,866 A | 5/1997 | Grant | 203/12 |
| 5,873,381 A | * 2/1999 | Han | 134/182 |
| 5,885,403 A | 3/1999 | Cheng | 156/345 |
| 5,922,138 A | * 7/1999 | Shindo et al. | 134/2 |
| 6,199,564 B1 | * 3/2001 | Yokomizo | 134/78 |
| 6,199,568 B1 | * 3/2001 | Arai et al. | 134/186 |
| 6,357,458 B2 | * 3/2002 | Tanaka et al. | 134/57 R |

* cited by examiner

Primary Examiner—Randy Gulakowski
Assistant Examiner—Saeed Chaudhry

(74) Attorney, Agent, or Firm—George O. Saile; Stephen B. Ackerman; Stephen G. Stanton

(57) ABSTRACT

A method for recycling a fluid in a wet bench tank recycling device, comprising the following steps. An outer recycle tank is provided having sides and a bottom. The outer recycle tank holding outer recycle tank fluid. An inner process tank is provided having sides and a sieved bottom housed within the outer recycle tank. The inner process tank sides being spaced apart from the sides of the outer recycle tank sides and the inner process tank bottom being spaced apart from the outer recycle tank bottom. The inner process tank holding inner process tank fluid. A wide area filter fitted within the inner process tank proximate the inner process tank sieved bottom is provided. A vertically moveable top cover is provided at an uppermost position and fitted between the inner process tank sides and the outer recycle tank sides. The top cover having one-way valves therein that permit flow of fluid only downward through the one-way valves. The vertically moveable top cover having a top and a bottom. A downward force means is provided to vertically depress the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid. An upward force means is provided to then vertically raise the moveable top cover back to the top cover uppermost position, whereby the inner process tank fluid on top of the top cover passes downward through the top cover one-way valves.

25 Claims, 2 Drawing Sheets

NON-TUBULAR TYPE RECYCLE SYSTEM OF WET BENCH TANK

BACKGROUND OF THE INVENTION

In the semiconductor industry, wet benches are utilized in many applications, such as photoresist stripping, silicon nitride removal, and silicon oxide removal, for example. Wet etch processes are characterized by high selectivity and isotropy.

The common hardware setting for wet benches is a series of tanks which have various functions, such as a main etch process tank, an intermediary washer tank, a rinse tank, a dryer tank, etc. As shown in FIG. 1, in a conventional wet bench recycling system, the main etch process tank 10 can generally be simplified as: an outer tank (recycle tank) 10 housing an inner tank (process tank) 12, a recycle tube 14 connecting the bottom of the outer tank 10, as at 15, to a pump 16, filter 18, heater 20, etc., and back to the. bottom of the inner tank 12, as at 21, so that fluid 22 in the outer tank 10 is pumped by the pump 16 through a filter 18, a heater 20, etc., and then into the bottom 21 of the inner tank 12 so that fluid 22 from the inner tank 12 overflows, as at 24, over the top of the inner tank 12 into the outer tank 10. Thus the fluid 22, such a chemical solvents, is recycled and used for additional runs.

However, some chemical solvents in wet processes are very viscous, i.e. thick and slow flowing, and get more so after series of runs. This causes undesirable "reaction incomplete" issues.

Chemical solvent reaction rates ($\gamma$) is generally related to temperature (T), the concentration gradient between the chemical solvent and etched film ($\Delta C$), and the turbulence (mixing) of flow ($\phi$), i.e.:

$$\gamma = fn(T, \Delta C, \phi)$$

Temperature (T), in most cases, is optimized and restricted by process limitations and can not be modified arbitrarily. The concentration gradient ($\Delta C$) can be obtained by supplementing new chemical solvent 22 frequently, however this sharply increases cost and is not economical. Unfortunately, the third key element of the chemical solvent reaction rate, the turbulence (mixing) of flow ($\phi$), usually performs poorly because of the high viscosity of some of the wet process chemical solvents 22, and also due to the current hardware design as shown in FIG. 1.

Viscous liquid moving within tubes will form laminar flow and the average velocity ($\upsilon$) can be calculated by the formula:

$$\upsilon = (\Delta P)(\text{square } D)/(32)(\mu)(\Delta L)$$

where:

$\upsilon$: the average velocity, m/s;

$\Delta P$: the driving pressure, N/square (m);

$D$: the inner diameter of the tube, m;

$\mu$: the viscosity of solvent, (N)(s/square (m))

$\Delta L$: the equivalent tube length, m.

Therefore, the recycle flow rate would be extremely low due to the high viscosity ($\mu$) of the solvent 22 and the equivalent tube length ($\Delta L$) so that the circulation and etching rate in the inner tank 12 will be poor.

Besides, the filters 18 are often seriously jammed by jelly-like remnants that reduce the driving pressure ($\Delta P$) after a few runs. To remedy this problem, either the chemical solvents 22 must be frequently renewed or the filters 18 must be frequently replaced.

U.S. Pat. No. 4,917,123 to McConnell et al describes a wafer treatment system including a recycle system.

U.S. Pat. No. 5,632,866 to Grant describes a point-of-use recycling of wafer cleaning substances.

U.S. Pat. No. 5,409,310 to Owczarz describes a semiconductor fluid blending system including a recycle.

U.S. Pat. No. 5,885,403 to Cheng describes a system for cleaning and etching a wafer that a buffer tank that stores a unique chemical solution, a loader for loading the wafer, and at least one process tank for retaining the loaded wafer. The process tank being coupled to the buffer tank to receive the chemical solution from the buffer tank and to perform the cleaning and etching of the wafer.

SUMMARY OF THE INVENTION

Accordingly, it is an object of one or more embodiments of the present invention to provide a wet bench recycle system usable with viscous chemical solvents.

Another object of one or more embodiments of the present invention is to provide a viscous chemical solvent wet bench recycle system that does not necessitate frequent changing of the chemical solvent.

Yet another object of one or more embodiments of the present invention is to provide a viscous chemical solvent wet bench recycle system that does not necessitate frequent changing of filters.

A further object of one or more embodiments of the present invention is to provide a viscous chemical solvent wet bench recycle system that has superior tank circulation compared to prior such systems.

Another object of one or more embodiments of the present invention is to provide a viscous chemical solvent wet bench recycle system that is easier to clean and maintain than conventional viscous chemical solvent wet bench tube recycle systems.

Another object of one or more embodiments of the present invention is to provide a viscous chemical solvent wet bench recycle system that has prolongs the chemical solvent and filter life cycles, gaining available system up-time.

Another object of one or more embodiments of the present invention is to provide a viscous chemical solvent wet bench recycle system that reduces process time, and gains throughput.

Other objects will appear hereinafter.

It has now been discovered that the above and other objects of the present invention may be accomplished in the following manner. Specifically, an outer recycle tank is provided having sides and a bottom. The outer recycle tank holding outer recycle tank fluid. An inner process tank is provided having sides and a sieved bottom housed within the outer recycle tank. The inner process tank sides being spaced apart from the sides of the outer recycle tank sides and the inner process tank bottom being spaced apart from the outer recycle tank bottom. The inner process tank holding inner process tank Fluid. A wide area filter fitted within the inner process tank proximate the inner process tank sieved bottom is provided. A vertically moveable top cover is provided at an uppermost position and fitted between the inner process tank sides and the outer recycle tank sides. The top cover having one-way valves therein that permit flow of fluid only downward through the one-way valves. The vertically moveable top cover having a top and a bottom. A downward force means is provided to vertically depress the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid. An upward force means is provided to then vertically raise the moveable top cover back to the top cover uppermost position, whereby the inner process tank fluid on top of the top cover passes downward through the top cover one-way valves.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Figure 1:
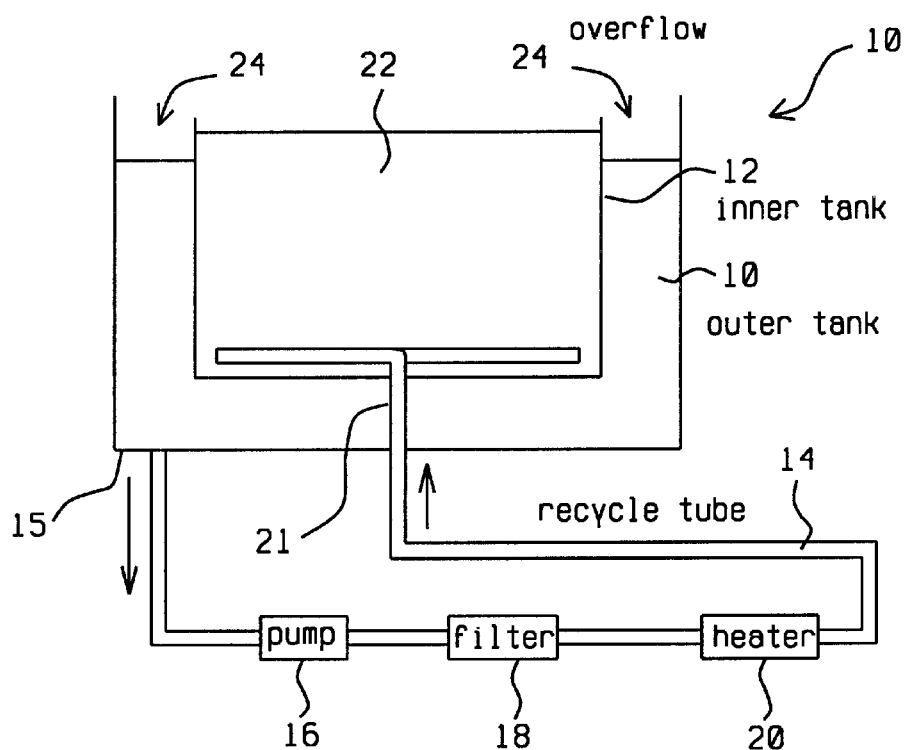
FIG. 1. illustrates a prior art wet bench tank recycling system.
Figure 2:
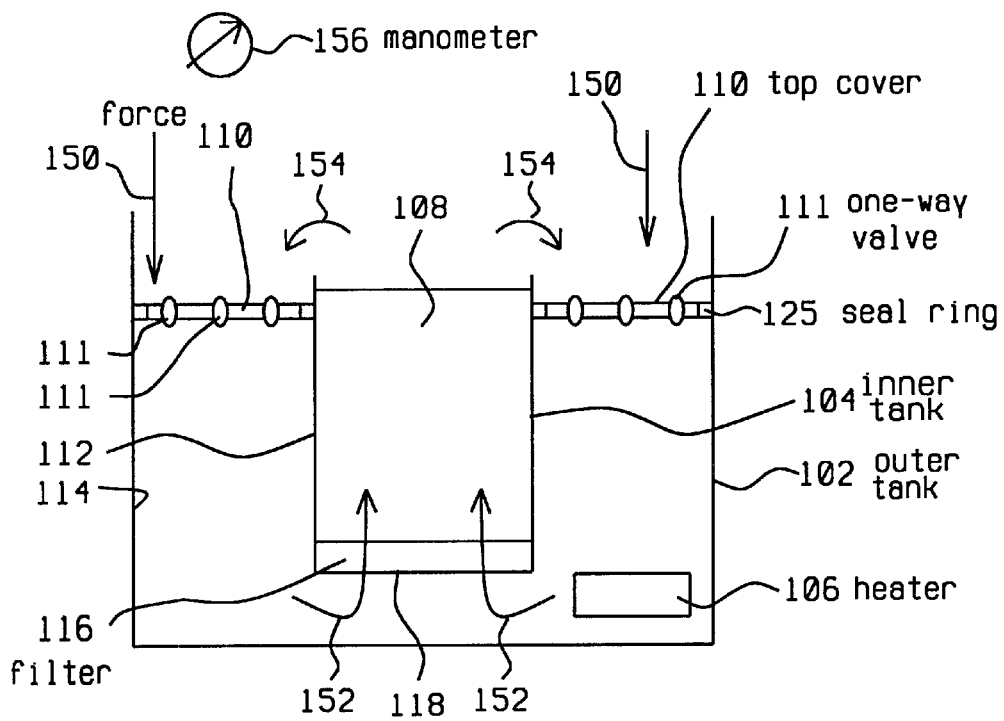
FIG. 2 illustrates the preferred embodiment of the present invention.

The inventor has discovered that using the tubeless recycling system 100 as shown in FIG. 2 solves the poor circulation, and filter and solvent lifetime issues, for example, of the conventional recycle system as shown in FIG. 1. The tubeless recycle system 100 of the present invention is characterized by, for example:

no recycle tubes are utilized, or needed, for recycling the fluid/chemical solvent flow which reduces velocity loss; and wide area filters are used to prolong filter lifetime.

Structure of the Tubeless Recycle System of the Present Invention

As shown in FIG. 2, the main etch process tank 100 may be simplified as an outer recycle tank 102 houses inner process tank 104. Heater 106 may be positioned within outer recycle tank 102 to heat fluid/solvent 108 as necessary to reduce the viscosity of fluid/solvent 108 to permit sufficient flowability of fluid/solvent 108.

Top cover 110 is moveably interposed between the outer walls 112 of inner process tank 104 and the inner walls 114 of outer recycle tank 102 over the exposed upper surface of fluid/solvent 108. Seal rings 125 provide a seal between moveable top cover 110 and the outer walls 112 of inner process tank 104, and the inner walls 114 of outer recycle tank 102. It is noted that seal rings 125 are not critical devices because the tubeless recycling system 100 is not designed for air/fluid tight compression.

Details of Sample One-Way Valves

Figure 3:
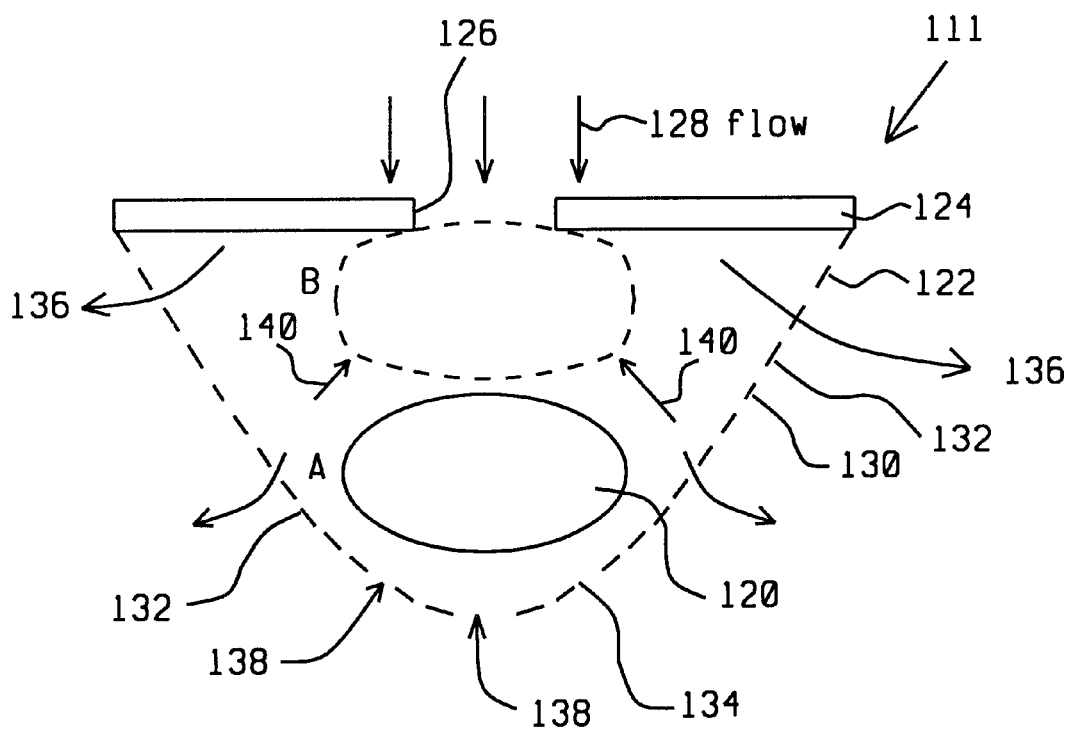
FIG. 3 illustrates the one-way valve used in conjunction with the preferred embodiment of the present invention.

Top cover 110 includes one-way valves 111 such that fluid/solvent 108 may only flow downward through top cover 110. FIG. 3 details an example such one-way valve 111 having ball 120 confined within conical shaped cavity 122. Upper horizontal wall 124 of conical cavity 122 has upper opening 126 through which fluid/solvent 108 may flow as at 128. Lower sieved walls 130 have openings or sieves 132 through which fluid/solvent 108 may freely flow.

When fluid/solvent 108 flows downward at 128 through upper opening 126 of upper horizontal wall 124, ball 120 is pressed against, and rests within the lower conical end 134 of lower sieved walls 130 at position A, and fluid/solvent 108 flows from conical cavity 122 through sieves 132 as at 136. However, if fluid/solvent 108 attempts to flow upwardly into conical cavity 122 as at 138, this upward fluid flow pressure 140 would press ball 120 upwardly into position B, blocking upper opening 126 of upper horizontal wall 124 and preventing. flow of fluid/solvent 108 upwardly through top cover 110.

Other designs of one-way valves 111.that accomplish the same one-way fluid/solvent 108 flow may be used.

As shown in FIG. 2, the bottom 118 of inner process tank 104 has sufficient openings (not shown) so that fluid/solvent 108 may flow freely through inner process tank bottom 118. Wide area filter 116 is placed at the bottom 118 of inner process tank 104 through which fluid/solvent 108 may also freely flow and which filters fluid/solvent 108. Wide area filter 116 may be a unitary filter or multiple filters. Wide area filter 116 has a high particle holding capacity and long life and is preferably comprised of a synthesized material, polypropylene fiber, fiberglass or a polymeric membrane and is more preferably a synthesized material.

In any event any fluid/solvent 108 flowing from outer recycle tank 102 into inner process tank 104 through the bottom of inner process tank 104 flows through wide area filter 116. The bottom of inner process tank 104 and wide area filter 116 must be wide enough so that the recycle flow at 152 will not be retarded or impeded.

After each semiconductor process cycle completion, such as within inner process tank 104, or periodically such as by time or by recycle fluid volume, a downward force 150 is applied to moveable top cover 110 so that top cover 110 presses/moves downwardly and compels fluid/solvent 108 in outer recycle tank 102 to recycle through wide area filter 116 and into inner process tank 104 as at 152. This causes overflow of spent, or processed fluid/solvent 108 over the upper side walls of inner process tank, as at 154, and onto top cover 110. When downward force 150 is released, and moveable top cover 110 is lifted upwards towards its original uppermost position as shown in FIG. 2, the overflow fluid/solvent 108 that had accumulated on the top of top cover 110 flows through one-way valves 111, as explained above, and into the bulk of outer tank 102.

Downward force 150 is preferably be applied by mechanical force or pneumatic force. This may also be used to lift top cover 110 upwards back to its uppermost position as shown in FIG. 2 when the top cover 110 reaches its lowermost position.

After this cycling of moveable top cover 110, recycled, cleaned fluid/solvent 108 fills inner process tank 104 and spent/processed fluid 108 fills outer recycle tank 102. Another semiconductor process cycle is then commenced within inner process tank 104 with recycled, cleaned fluid/solvent 108.

Since the viscous fluid/chemical solvent 108 need not, and does not, pass through any tubes having greatly restricted flow patterns compared to the process of the tubeless recycling system 100 of the present invention, the low recycle flow rate issue and poor circulation issue of the conventional tube recycle system 10 of FIG. 1 can be greatly reduced or eliminated.

A manometer 156 is may be used to determine if wide area filter 116 has failed.

Improvement of Chemical Solvent Reaction Rates

According to the chemical solvent reaction rate (γ) formula:

$$\gamma = fn(T, \Delta C, \phi)$$

where T=temperature; ΔC=the concentration gradient between the chemical solvent and etched film; and φ=the turbulence (mixing) of flow. When the process is well mixed by using the tubeless recycling system 100 of the present invention, the fluid/chemical solvent 108 can either be utilized for more runs, or the process time can be reduced.

Also, using the tubeless recycling system 100 of the present invention can extend the lifetime of wide area filter 116 and can increase the available tool (tubeless recycling system 100) time. Assuming a filter failed when the jam thickness "d" reaches a certain value for that filter, then:

$$d = V/A$$

where:

d=jam thickness of filter;

V=amount of remnant; and

A=area of filter.

In the tubeless recycling system 100 of the present invention, a wide area filter 116 is used which covers the bottom area of inner process tank 104. Therefore A of wide filter 116 is greatly increased so one would be capable of loading of "V," i.e. increasing the amount of remnant V and still maintaining the same jam thickness d, or time of wide area filter 116 failure, or for the same amount of remnant V, the lifetime the lifetime of wide area filter 116 can be extended and thus the available up-time for the tool (the tubeless recycling system 100) is increased.

Advantages of the Present Invention

The advantages of the tubeless recycling system of the present invention include:

1) a superior tank circulation;

2) ease of cleaning and maintenance compared with a system having fluid recycle tubes;

3) a prolongation of chemical solvent and filter lifetime which improves the tool availability up-time;

4) a reduction of processing time; and 5) a gain in the throughput.

While particular embodiments of the present invention have been illustrated and described, it is not intended to limit the invention, except as defined by the following claims.

I claim:

1. A method for recycling a fluid in a wet bench tank recycling device, comprising the steps:

providing an outer recycle tank having sides and a bottom; the outer recycle tank holding outer recycle tank fluid;

providing an inner process tank having sides and a sieved bottom housed within the outer recycle tank, the inner process tank sides spaced apart from the sides of the outer recycle tank sides and the inner process tank bottom spaced apart from the outer recycle tank bottom; the inner process tank holding inner process tank fluid;

providing a wide area filter fitted within the inner process tank proximate the inner process tank sieved bottom;

providing a vertically moveable top cover at an uppermost position and fitted between the inner process tank sides and the outer recycle tank sides; the top cover having one-way valves therein that permit flow of fluid only downward through the one-way valves; the vertically moveable top cover having a top and a bottom;

providing a downward force means to vertically depress the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid; and providing an upward force means to then vertically raise the moveable top cover back to the top cover uppermost position, whereby the inner process tank fluid on top of the top cover passes downward through the top cover one-way valves.

2. The method of claim 1, wherein the inner process tank fluid is used to process a semiconductor wafer, whereby the inner process tank fluid is processed and the recycled outer recycle tank fluid replaces at least a portion of the processed inner process tank fluid upon exertion of the downward force on the moveable top cover to vertically depress the moveable top cover.

3. The method of claim 1, further including the step of providing seal rings interposed between the vertically moveably top cover and the inner process tank sides and the outer recycle tank sides.

4. The method of claim 1, whereby the wide area filter is comprised of multiple separate filters.

5. A method for recycling a fluid in a wet bench tank recycling device, comprising the steps:

providing an outer recycle tank having sides and a bottom; the outer recycle tank holding outer recycle tank fluid;

providing a heater within the outer recycle tank to heat the outer recycle tank fluid, providing an inner process tank having sides and a sieved bottom housed within the outer recycle tank, the inner process tank sides spaced apart from the sides of the outer recycle tank sides and the inner process tank bottom spaced apart from the outer recycle tank bottom; the inner process tank holding inner process tank fluid;

providing a wide area filter fitted within the inner process tank proximate the inner process tank sieved bottom;

providing a vertically moveable top cover at an uppermost position and fitted between the inner process tank sides and the outer recycle tank sides; the top cover having one-way valves therein that permit flow of fluid only downward through the one-way valves; the vertically moveable top cover having a top and a bottom;

providing a downward force means to vertically depress the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid; and providing an upward force means to then vertically raise the moveable top cover back to the top cover uppermost position, whereby the inner process-tank fluid on top of the top cover passes downward through the top cover one-way valves.

6. The method of claim 5, wherein the inner process tank fluid is used to process a semiconductor wafer, whereby the inner process tank fluid is processed and the recycled outer recycle tank fluid replaces at least a portion of the processed inner process tank fluid upon exertion of the downward force on the moveable top cover to vertically depress the moveable top cover.

7. The method of claim 5, further including the step of providing seal rings interposed between the vertically moveably top cover and the inner process tank sides and the outer recycle tank sides.

8. The method of claim 5, whereby the wide area filter is comprised of multiple separate filters.

9. The method of claim 5, whereby the wide area filter has a high particle holding capacity and is comprised of a material selected from the group consisting of a synthesized material, polypropylene fiber, fiberglass and a polymeric membrane.

10. A wet bench tank recycling device for recycling fluid, comprising:
  an outer recycle tank having sides and a bottom; the outer recycle tank 102 holding outer recycle tank fluid;
  an inner process tank having sides and a sieved bottom housed within the outer recycle tank, the inner process tank sides spaced apart from the sides of the outer recycle tank sides and the inner process tank bottom spaced apart from the outer recycle tank bottom; the inner process tank holding inner process tank fluid;
  a wide area filter fitted within the inner process tank proximate the inner process tank sieved bottom;
  a vertically moveable top cover at an uppermost position and fitted between the inner process tank sides and the outer recycle tank sides; the top cover having one-way valves therein that permit flow of fluid only downward through the one-way valves; the vertically moveable top cover having a top and a bottom;
  downward force means to vertically depress the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid; and
  upward force means to then vertically raise the moveable top cover back to the top cover uppermost position, whereby the inner process tank fluid on top of the top cover passes downward through the top cover one-way valves.

11. The device of claim 10, wherein the outer recycle tank includes a heater to heat the outer recycle tank fluid.

12. The device of claim 10, wherein the inner process tank fluid is used to process a semiconductor wafer, whereby the inner process tank fluid is processed and the recycled outer recycle tank fluid replaces at least a portion of the processed inner process tank fluid upon exertion of the downward force on the moveable top cover to vertically depress the moveable top cover.

13. The device of claim 10, whereby seal rings are interposed between the vertically moveably top cover and the inner process tank sides and the outer recycle tank sides.

14. The device of claim 10, whereby the wide area filter is comprised of multiple separate filters.

15. The device of claim 10, whereby the wide area filter has a high particle holding capacity and is comprised of a material selected from the group consisting of a synthesized material, polypropylene fiber, fiberglass and a polymeric membrane.

16. A method for recycling a fluid in a wet bench tank recycling device, comprising the steps:
  providing an outer recycle tank having sides and a bottom; the outer recycle tank holding outer recycle tank fluid;
  providing an inner process tank having sides and a sieved bottom housed within the outer recycle tank, the inner process tank sides spaced apart from the sides of the outer recycle tank sides and the inner process tank bottom spaced apart from the outer recycle tank bottom; the inner process tank holding inner process tank fluid;
  providing a wide area filter fitted within the inner process tank proximate the inner process tank sieved bottom; the wide area filter having a high particle holding capacity;
  providing a vertically moveable top cover at an uppermost position and fitted between the inner process tank sides and the outer recycle tank sides; the top cover having one-way valves therein that permit flow of fluid only downward through the one-way valves; the vertically moveable top cover having a top and a bottom;
  providing a downward force means to vertically depress the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid; and
  providing an upward force means to then vertically raise the moveable top cover back to the top cover uppermost position, whereby the inner process tank fluid on top of the top cover passes downward through the top cover one-way valves.

17. The method of claim 16, including the step of providing a heater within the outer recycle tank to heat the outer recycle tank fluid.

18. The method of claim 16, wherein the inner process tank fluid is used to process a semiconductor wafer, whereby the inner process tank fluid is processed and the recycled outer recycle tank fluid replaces at least a portion of the processed inner process tank fluid upon exertion of the downward force on the moveable top cover to vertically depress the moveable top cover.

19. The method of claim 16, further including the step of providing seal rings interposed between the vertically moveably top cover and the inner process tank sides and the outer recycle tank sides.

20. The method of claim 16, whereby the wide area filter is comprised of multiple separate filters.

21. A method for recycling a fluid in a wet bench tank recycling device, comprising the steps:
  providing an outer recycle tank having sides and a bottom; the outer recycle tank holding outer recycle tank fluid;
  providing an inner process tank having sides and a sieved bottom housed within the outer recycle tank, the inner process tank sides spaced apart from the sides of the outer recycle tank sides and the inner process tank bottom spaced apart from the outer recycle tank bottom; the inner process tank holding inner process tank fluid;
  providing a wide area filter fitted within the inner process tank proximate the inner process tank sieved bottom;

the wide area filter having a high particle holding capacity; the wide area filter being comprised of a material selected from the group consisting of a synthesized material, polypropylene fiber, fiberglass and a polymeric membrane, providing a vertically moveable top cover at an uppermost position and fitted between the inner process tank sides and the outer recycle tank sides; the top cover having one-way valves therein that permit flow of fluid only downward through the one-way valves; the vertically moveable top cover having a top and a bottom;

providing a downward force means to vertically depress. the moveable top cover downward, forcing a portion of the outer recycle tank fluid through the inner process tank sieved bottom and the wide area filter whereby a portion the inner process tank fluid is forced upwardly and over the inner process tank sides and onto the top of the top cover, and whereby passage of the outer recycle tank fluid through the wide area filter recycles the outer recycle tank fluid; and providing an upward force means to then vertically raise the moveable top cover back to the top cover uppermost position, whereby the inner process tank fluid on top of the top cover passes downward through the top cover one-way valves.

22. The method of claim 21, including the step of providing a heater within the outer recycle tank to heat the outer recycle tank fluid.

23. The method of claim 21, wherein the inner process tank fluid is used to process a semiconductor wafer, whereby the inner process tank fluid is processed and the recycled outer recycle tank fluid replaces at least a portion of the processed inner process tank fluid upon exertion of the downward force on the moveable top cover to vertically depress the moveable top cover.

24. The method of claim 21, further including the step of providing seal rings interposed between the vertically moveably top cover and the inner process tank sides and the outer recycle tank sides.

25. The method of claim 21, whereby the wide area filter is comprised of multiple separate filters.

\* \* \* \* \*